United States Patent
Garimella et al.

(10) Patent No.: US 10,599,880 B1
(45) Date of Patent: Mar. 24, 2020

(54) SYSTEMS AND METHODS FOR SIMULATING REAL-WORLD IO WORKLOADS IN A PARALLEL AND DISTRIBUTED STORAGE SYSTEM

(71) Applicant: Sycomp A Technology Company, Inc., Foster City, CA (US)

(72) Inventors: Neeta Garimella, Foster City, CA (US); Kashyap Garimella, Foster City, CA (US)

(73) Assignee: Sycomp, A Technology Company, Inc., Foster City, CA (US)

( * ) Notice: Subject to any disclaimer, the term of this patent is extended or adjusted under 35 U.S.C. 154(b) by 0 days.

(21) Appl. No.: 16/435,394

(22) Filed: Jun. 7, 2019

(51) Int. Cl.
*G06F 30/20* (2020.01)
*G06F 11/30* (2006.01)
*G06F 16/22* (2019.01)
*G06F 11/34* (2006.01)

(52) U.S. Cl.
CPC .......... *G06F 30/20* (2020.01); *G06F 11/3006* (2013.01); *G06F 11/3034* (2013.01); *G06F 11/3457* (2013.01); *G06F 16/2246* (2019.01)

(58) Field of Classification Search
None
See application file for complete search history.

(56) References Cited

U.S. PATENT DOCUMENTS

| | | | | |
|---|---|---|---|---|
| 2014/0012562 A1* | 1/2014 | Chang | ................ | G06F 11/3461 703/22 |
| 2015/0046141 A1* | 2/2015 | Lahiri | .................... | G06F 9/455 703/13 |
| 2016/0092468 A1* | 3/2016 | Hildebrand | ............ | G06Q 10/00 707/633 |

OTHER PUBLICATIONS

Feng, W. C., Goel, A., Bezzaz, A., Feng, W. C., & Walpole, J. (2003, Aug.). TCPivo: A high-performance packet replay engine. In Proceedings of the ACM SIGCOMM workshop on Models, methods and tools for reproducible network research (pp. 57-64). ACM. (Year: 2003).*

Zhou, X., Pang, H., & Tan, K. L. (Apr. 2004). Hiding data accesses in steganographic file system. In Proceedings. 20th International Conference on Data Engineering (pp. 572-583). IEEE. (Year: 2004).*

Axboe; Flexible I/O tester; accessed on Jul. 31, 2019 at https://fio.readthedocs.io/en/latest/ 71 pages; (year of pub. sufficiently earlier than effective US filing date and any foreign priority date) 2017.

Norcott et al.; Iozone Filesystem Benchmark; accessed on Jul. 31, 2019 at http://www.iozone.org/; 4 pages; Jan. 23, 2016.

(Continued)

*Primary Examiner* — Bijan Mapar
(74) *Attorney, Agent, or Firm* — Shay Glenn LLP

(57) ABSTRACT

Systems, methods, and storage media for simulating real-world IO workload for testing a parallel and distributed storage system are disclosed. Exemplary implementations may: identify real-world data from a deployed production environment; simulate a workload by using the original directory tree structure and the original metadata from the files and replacing the original contents of the files with dummy content to create dummy files; write the directory tree structure and dummy files to a system of storage devices; read data from the directory tree structure and dummy files on the system of storage devices; and verify the integrity of the dummy files over the course of a plurality of data management processes and a plurality of data availability processes employed by the storage system.

17 Claims, 6 Drawing Sheets

(56) References Cited

OTHER PUBLICATIONS

Standard Performance Evaluation Corporation; SPEC SFS (Reg. TM); accessed on Jul. 31, 2019 at https://www.spec.org/sfs2014/; 2 pages; (year of pub. sufficiently earlier than effective US filing date and any foreign priority date) 2014.

* cited by examiner

```
####################################################################################
# This is a comment. This line will be ignored by the program.                     #
# -file <input file> is used to declare an input file.                             #
#   EXAMPLE: -file sample.pol.gz                                                   #
# -find <string> is the string you want to replace.                                #
#   EXAMPLE: -find /gpfs3/                                                         #
# -replace <string> is the string you want to replace with                         #
#   EXAMPLE -replace gpfs0/mywload/                                                #
# -size <(int) size(K, M, or G)> <percentage occurrence> is the size in Kilobytes(K), Megabytes(M), or #
#       Gigabytes(G)                                                               #
#   Multiple lines starting with -size can be entered. Make sure that your percentages don't go over 100! #
#   EXAMPLE -size 10K 50                                                           #
# -default <(int) size(K, M, or G)> is the default size you would like your files to be, outside of the #
#       percentage distribution                                                    #
# -end    Ends the file. The file MUST END with this command                       #
####################################################################################

-threads 3
-recreate  1

-file /gpfs/gcp-2m-me1/WORKLOAD-A/corp-file-aa.gz
-find .
-replace /gpfs/gcp-2m-me1/real-data-set1
-size 10K 40
-size  2G 2
-default 1K -file /gpfs/gcp-2m-me1/WORKLOAD-B//corp-file-ab.gz
-find .
-replace /gpfs/gcp-2m-me1/real-data-set1
-size 1M 40
-size 100M 40
-default 1K -file /gpfs/gcp-2m-me1/WORKLOAD-C/corp-file-ac.gz
-find .
-replace /gpfs/gcp-2m-me1/real-data-set2
-size 4K 80
-size 10M 15
-default 1K -end

This config file will allow for skeleton systems to be created from 3 systems in 3 separate directories
# Each will have its own unique distribution of file sizes
```

FIG. 3

SYSTEMS AND METHODS FOR SIMULATING REAL-WORLD IO WORKLOADS IN A PARALLEL AND DISTRIBUTED STORAGE SYSTEM

INCORPORATION BY REFERENCE

All publications and patent applications mentioned in this specification are herein incorporated by reference to the same extent as if each individual publication or patent application was specifically and individually indicated to be incorporated by reference.

FIELD

The present disclosure relates to computer storage systems. More specifically, the present disclosure relates to tools for simulating real-world workloads for testing computer storage systems.

BACKGROUND

When computer storage systems are being developed, there is a need to conduct testing on their performance. There are many purpose-built workload generator tools in the prior art to meet specific input/output (TO) requirements for this purpose. Many of these workload generator tools serve to benchmark performance. Examples include fio—Flexible I/O tester, developed by Jens Axboe and described at https://fio.readthedocs.io/en/latest/, IOzone Filesystem Benchmark, developed by William Norcott et al. and described at http://www.iozone.org/, and SPEC SFS® 2014, provided by Standard Performance Evaluation Corporation of Gainesville, Va. and described at https://www.spec.org/sfs2014/. Such tools generate specified workload (input/output operations per second (IOPS) centric, bandwidth centric, etc.) by generating IO within a predefined storage capacity by continually over-writing the data within the given capacity. Many tend to create a single large file and assign a range within the file to each IO thread.

Computer storage systems are often optimized or tuned for workloads specific to an industry or customer. When they are tested before being deployed, a hypothetical workload is typically used. Such a workload may test the storage system under specific and narrow use cases or where the system under test is known to perform well. However, storage systems may not perform as well under real-world conditions after being deployed.

Due to the lack of versatile tooling, the exposure to real-world IO patterns continues to be part of the product deployment phase rather than development phase and is typically owned by the application owner/customers. This makes the overall product stability process very long and challenging, requiring product to be deployed in a variety of environments to uncover systemic issues. Additionally, the deployment phase tends to have other constraints and often has a short timeframe. Finding and fixing code bugs typically are not objectives of this phase.

Accordingly, there is greater need for tooling to simulate real-world IO to ensure breadth and depth of system testing during the product development cycle and for performance evaluation under multitudes and varieties of workloads that the storage system is subjected to when deployed as an enterprise-wide storage system.

SUMMARY OF THE DISCLOSURE

One aspect of the present disclosure relates to a system configured for simulating real-world IO workload for testing a parallel and distributed storage system. The system may include one or more hardware processors configured by machine-readable instructions. The processor(s) may be configured to identify real-world data from a deployed production environment. The data may include a directory tree structure and files. The files may include original metadata such as owning user and group, access permissions, etc., while the original contents (which may be confidential) are not required or even accessed. The processor(s) may be configured to simulate a workload by using the original directory tree structure and the original metadata from the files and replacing the original contents of the files with dummy content to create dummy files. The processor(s) may be configured to write the directory tree structure and dummy files to a system of storage devices. The processor(s) may be configured to read data from the directory tree structure and dummy files on the system of storage devices. The processor(s) may be configured to verify the integrity of the dummy files over the course of a plurality of data management processes and a plurality of data availability processes employed by the storage system.

In some implementations of the system, the processor(s) may be configured to modify the dummy files on the system of storage devices.

In some implementations of the system, replacing the original contents of the files may include creating a dummy data block and replicating the dummy block multiple times within a file to obtain a desired file size for each of a plurality of the dummy files.

In some implementations of the system, the dummy block may have a size that is user-definable.

In some implementations of the system, the dummy block may have a size of at least 1 MB. In some implementations of the system, each file may have a size of at least 1 GB and the directory tree includes at least 1000 files.

In some implementations of the system, the contents of the dummy block may be stored in a buffer having the same size as the contents.

In some implementations of the system, the contents of the dummy block may be randomly generated.

Another aspect of the present disclosure relates to a method for simulating real-world IO workload for testing a parallel and distributed storage system. The method may include identifying real-world data from a deployed production environment. The data may include a directory tree structure and files. The files may include original metadata and original file contents. The method may include simulating a workload by using the original directory tree structure and the original metadata from the files and replacing the original contents of the files with dummy content to create dummy files. The method may include writing the directory tree structure and dummy files to a system of storage devices. The method may include reading data from the directory tree structure and dummy files on the system of storage devices. The method may include verifying the integrity of the dummy files over the course of a plurality of data management processes and a plurality of data availability processes employed by the storage system.

In some implementations of the method, it may further include the step of modifying the dummy files on the system of storage devices.

In some implementations of the method, replacing the original contents of the files may include creating a dummy data block and replicating the dummy block multiple times within a file to obtain a desired file size for each of a plurality of the dummy files.

In some implementations of the method, the dummy block may have a size that is user-definable.

In some implementations of the method, the dummy block may have a size of at least 1 MB. In some implementations of the method, each file may have a size of at least 1 GB and the directory tree includes at least 1000 files.

In some implementations of the method, the contents of the dummy block may be stored in a buffer having the same size as the contents.

In some implementations of the method, the contents of the dummy block may be randomly generated.

In some implementations of the method, the dummy block comprises binary content.

In some implementations of the method, the dummy block comprises text content.

In some implementations of the method, each of the dummy files further comprises a unique data block that is different from the dummy block.

In some implementations of the method, each of the dummy files is created from a single dummy block.

In some implementations of the method, each of the dummy files is not created from a single dummy block.

In some implementations of the method, each of the dummy files is created from a unique dummy block to fingerprint the dummy files to aid in identifying the nature of any data corruption or integrity issues.

In some implementations of the method, the step of verifying the integrity of the dummy files comprises comparing a first block of one of the dummy files to a second block of the same dummy file.

In some implementations of the method, the step of verifying the integrity of the dummy files further comprises comparing the first block of the one dummy file to a third block of the same dummy file, and if the first, second and third blocks match perfectly, defining one of the three blocks as a pristine block.

In some implementations of the method, the pristine block is defined after it has been compared to and perfectly matches n other blocks, wherein n is an integer that can be customized by a user.

In some implementations of the method, the pristine block is compared to all other dummy blocks in the same dummy file.

In some implementations of the method, if a dummy block does not match the pristine block, a determination is made as to whether neighboring blocks also do not match the pristine block but match each other in order to help diagnose the nature of corruption or integrity issues.

In some implementations of the method, the process of defining a pristine block and comparing it to all other blocks in the same dummy file is performed on each of the dummy files in the directory tree structure.

In some implementations of the method, a checksum procedure is used instead of a pristine block to verify the integrity of all files in the directory tree structure that are no greater than a predetermined size.

In some implementations of the method, the predetermined size is 8 KB.

In some implementations of the method, a checksum procedure is used instead of a pristine block to verify the integrity of all files in the directory tree structure that have less than a predetermined number of dummy blocks.

In some implementations of the method, the predetermined number of dummy blocks is two.

In some implementations of the method, the step of simulating a workload comprises selecting a first file size, and selecting a first percentage of the files to be created with the dummy content that are to have the first file size.

In some implementations of the method, the step of simulating a workload comprises selecting a second file size, and selecting a second percentage of the files to be created with the dummy content that are to have the second file size.

In some implementations of the method, the step of simulating a workload comprises selecting a default file size such that any remaining percentage of the files to be created with the dummy content that fall outside of the first and the second percentages and any other similarly selected percentages are to have the default file size.

In some implementations of the method, the dummy files each have a file size that approximates a file size of a corresponding file of the real-world data.

In some implementations, the method further comprises simulating a plurality of workloads and simultaneously/concurrently writing, reading or writing and reading the directory tree structure and the dummy files of the plurality of simulated workloads to the system of storage devices.

In some implementations, the method further comprises selecting a first unique file size for each of the plurality of simulated workloads, and selecting a first unique percentage of the files to be created with the dummy content that are to have the first file size for each of the plurality of simulated workloads.

In some implementations, the method further comprises selecting a second unique file size for each of the plurality of simulated workloads, and selecting a second unique percentage of the files to be created with the dummy content that are to have the second file size for each of the plurality of simulated workloads.

In some implementations, the method further comprises selecting a default unique file size for each of the plurality of simulated workloads, such that any remaining percentage of the files to be created with the dummy content that fall outside of the first and the second unique percentages and any other similarly selected percentages are to have the default unique file size.

In some implementations of the method, the step of simulating a workload comprises selecting a read/write ratio which specifies relative amounts of time to be spent in the reading and the writing steps.

In some implementations of the method, the step of simulating a workload comprises selecting a read/write ratio which specifies relative amounts of data to read and write.

In some implementations of the method, the unique dummy block comprises a full file name and directory path.

In some implementations of the method, the unique dummy block comprises a file name.

In some implementations of the method, the unique dummy block comprises a timestamp.

In some implementations of the method, the unique dummy block comprises an inode.

In some implementations of the method, the simulating a workload step is implemented without obtaining a copy of the original file contents of the real-world data from the deployed production environment.

In some implementations of the method, the dummy files are self-verified during the verifying step without accessing the real-world data from the deployed production environment.

In some implementations of the method, the metadata includes at least one item from the group consisting of a file's owner, a group that the owner may belong to, permissions, file size, tags and labels.

Yet another aspect of the present disclosure relates to a non-transient computer-readable storage medium having instructions embodied thereon, the instructions being executable by one or more processors to perform a method for simulating real-world IO workload for testing a parallel and distributed storage system. The method may include identifying real-world data from a deployed production environment. The data may include a directory tree structure and files. The files may include original metadata and original file contents. The method may include simulating a workload by using the original directory tree structure and the original metadata from the files and replacing the original contents of the files with dummy content to create dummy files. The method may include writing the directory tree structure and dummy files to a system of storage devices. The method may include reading data from the directory tree structure and dummy files on the system of storage devices. The method may include verifying the integrity of the dummy files over the course of a plurality of data management processes and a plurality of data availability processes employed by the storage system.

In some implementations of the computer-readable storage medium, the method may further include the step of modifying the dummy files on the system of storage devices.

In some implementations of the computer-readable storage medium, replacing the original contents of the files may include creating a dummy data block and replicating the dummy block multiple times within a file to obtain a desired file size for each of a plurality of the dummy files.

In some implementations of the computer-readable storage medium, the dummy block may have a size that is user-definable.

In some implementations of the computer-readable storage medium, the dummy block may have a size of at least 1 MB. In some implementations of the computer-readable storage medium, each file may have a size of at least 1 GB and the directory tree includes at least 1000 files.

In some implementations of the computer-readable storage medium, the contents of the dummy block may be stored in a buffer having the same size as the contents.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF THE DRAWINGS

FIG. 3 illustrates an example configuration file, in accordance with one or more implementations.

DETAILED DESCRIPTION

According to aspects of the present disclosure, a system may be configured for simulating real-world input/output (IO) workload for testing in a parallel and distributed storage system. Such a workload simulator may use real metadata that is derived from an already deployed production environment. This can be accomplished by using a UNIX Find command to dump the directory tree of the real data. Alternatively, other similar tooling may be used for this purpose, such as a policy engine of IBM Spectrum Scale, formerly known as IBM General Parallel File System (GPFS). This directory/file tree may then be used to simulate the 10 patterns (e.g. metadata intensive or data intensive, read/write ratio, etc.) that are prevalent in the existing workload. Additionally, the tool can be easily configured to generate any 10 patterns to closely mimic the desired workload for system level and performance testing in a more realistic fashion.

The simulation tools disclosed herein may also verify data that have already been written, thus ensuring the underlying file system/storage system is able to safely manage data over the long term as bits comprising the file contents and meta data get shuffled around different storage media, and maintain desired data availability and redundancies across data centers or within a data center.

Before describing the inventive simulation tools in more detail, the drawbacks of prior art methods will be further described. In addition to the performance tools described in the Background section of this disclosure, there are other "poor man's tools" based on copying publicly available data archives (e.g. from NASA and other web data) into the storage using parallel copy tools such as rsync (see https://en.wikipedia.org/wiki/Rsync for further information) or similar customized tooling. Such tooling does not provide much control to manage IO patterns, and these tools rely on an entire source data set. A copy of this data set (which may be very large), or access to the data set, needs to be maintained for an extended period of time if extensive testing is to be done on the storage system. Problems can emerge if these data sets become corrupted between the start and conclusion of the testing.

There is another class of tools that typically writes data and verifies it immediately after writing or before the data set is overwritten in a next iteration. However, these tools cannot ensure data correctness days or months after the data were ingested. Additionally, the same dataset repeatedly gets overwritten to constraint capacity utilization. Such tooling poses several limitations in being able to test a complex storage system in a realistic manner. A checksum routine is sometimes used to verify data in these prior art tools, but such routines are very processor-intensive. The simulation systems disclosed herein overcome these drawbacks and provide additional advantages, as will become apparent from the following detailed description.

Figure 1:
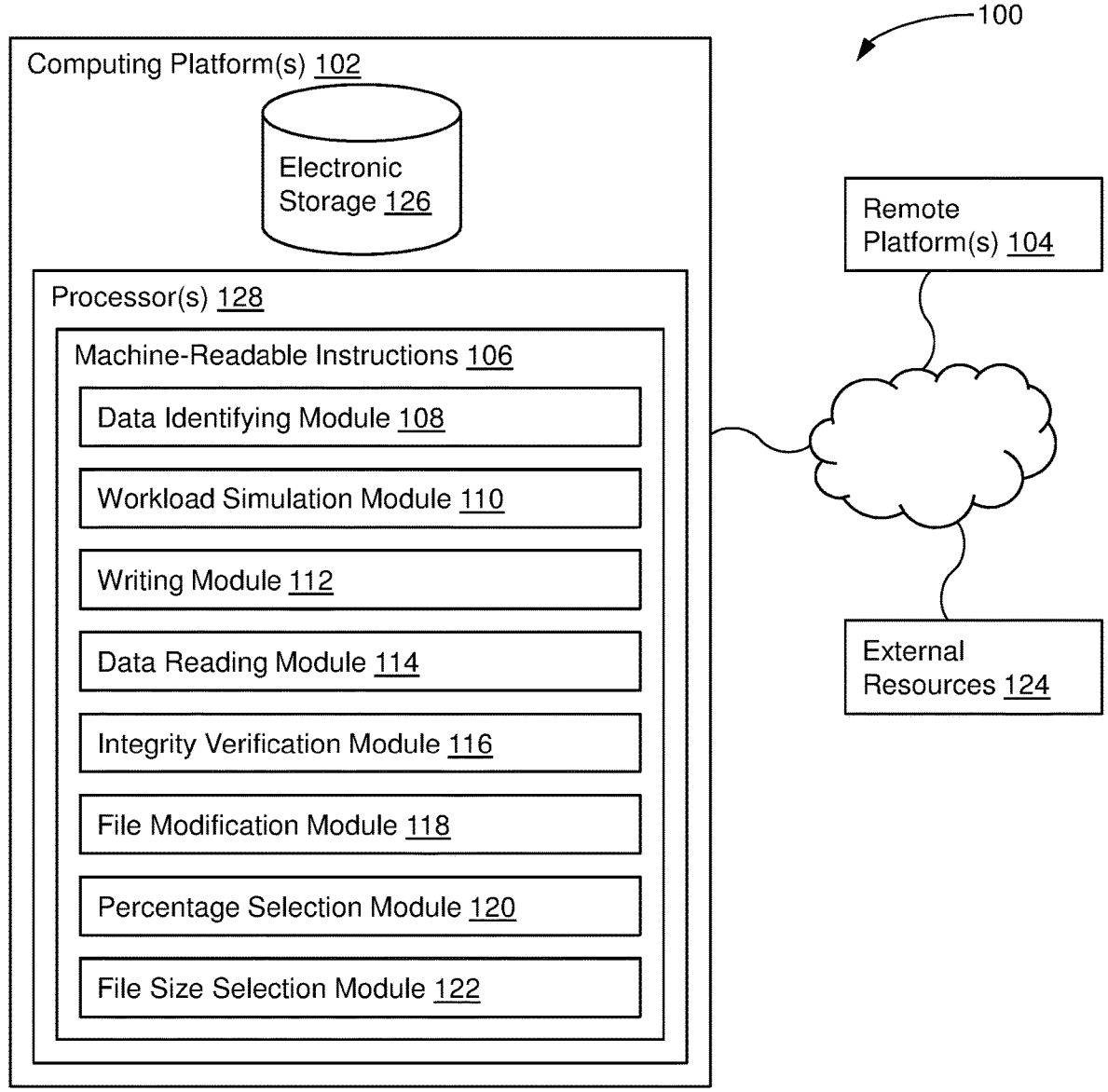
FIG. 1 illustrates a system configured for simulating real-world 10 workload for testing in a parallel and distributed storage system, in accordance with one or more implementations.

Referring to FIG. 1, an exemplary system 100 is illustrated. System 100 is configured for simulating real-world IO workload for testing in a parallel and distributed storage system, in accordance with one or more implementations of the present disclosure. In some implementations, system 100 may include one or more computing platforms 102. Computing platform(s) 102 may be configured to communicate with one or more remote platforms 104 according to a client/server architecture, a peer-to-peer architecture, and/or other architectures. Remote platform(s) 104 may be configured to communicate with other remote platforms via computing platform(s) 102 and/or according to a client/server architecture, a peer-to-peer architecture, and/or other architectures. Users may access system 100 via remote platform(s) 104.

Computing platform(s) 102 may be configured by machine-readable instructions 106. Machine-readable instructions 106 may include one or more instruction modules. The instruction modules may include computer program modules. The instruction modules may include one or more of data identifying module 108, workload simulation module 110, directory tree structure writing module 112, data reading module 114, integrity verification module 116, file modification module 118, percentage selection module 120, file size selection module 122, and/or other instruction modules.

Data identifying module 108 may be configured to identify real-world data from a deployed production environment. In some implementations, module 108 may be fully autonomous, semi-autonomous, or replaced by a human user performing the identifying function. Module 108 and/or the user may serve to identify a set or sets of real-world data that will be as close as possible to the types of data that the storage system will interact with once deployed. This identified real-world data will serve as the basis for a simulated workload for performance, data integrity and or operational testing of the storage system.

The real-world data may include a directory tree structure and files. The directory tree may have a single level but will typically have many levels. Each of the files located in the level or various levels of the directory tree may include original metadata and original file contents.

Workload simulation module 110 may be configured to simulate a workload by using the original directory tree structure identified by module 108 and or the user of the system. The original metadata from the files is also used by simulation module 110. However, the original contents of the files may be replaced with dummy content to create dummy files. The dummy content may be any arbitrary content, as will be later described in more detail. The dummy files may each have a file size that approximates a file size of a corresponding file of the real-world data. As such, the dummy files may closely mimic the original files (e.g. they may have the same names, sizes, metadata, locations in the directory tree, etc.) but have different content from the original real-world data files.

Workload simulation module 110 may be configured to simulate a plurality of workloads to simultaneously/concurrently write, read or write and read the directory tree structure and the dummy files of the plurality of simulated workloads to the system of storage devices. In other words, system 100 may be configured to run a single workload at any one time, run two workloads, three workloads, or a multitude of workloads at the same time. Simulating a workload may include allowing a user to select a read/write ratio which specifies relative amounts of time to be spent in the reading and the writing steps. In some implementations, simulating a workload may include selecting a read/write ratio which specifies relative amounts of data to read and write. The simulating a workload step may be implemented by simulation module 110 without obtaining a copy of the original file contents of the real-world data from the deployed production environment.

Writing module 112 may be configured to write the directory tree structure and dummy files to a system of storage devices. Data reading module 114 may be configured to read data from the directory tree structure and dummy files on the system of storage devices. Integrity verification module 116 may be configured to verify the integrity of the dummy files over the course of a plurality of data management processes and a plurality of data availability processes employed by the storage system. For example, such operations can include a data rebuild from parity/RAID code, a data rebalance across available storage media as media is damaged, or as data and/or media is added over a period of time. In this manner, the simulated workload may be used for performance, data integrity and or operational testing of the storage system.

Replacing the original contents of the files in the workload simulation module may include creating a dummy data block and replicating the dummy block multiple times within a file to obtain a desired file size for each of a plurality of the dummy files. The dummy block may have a size that is user-definable. In some implementations, the dummy block has a size of at least 4 KB, or at least 1 MB. Each file may have a size of at least 1 GB and the directory tree may include at least 1000 files.

The contents of the dummy block may be stored in a buffer having the same size as the contents. The contents of the dummy block may be randomly generated. The dummy block may include binary content. The dummy block may include text content. Each of the dummy files may further include a unique data block that is different from the dummy block. Each of the dummy files may be created from a single dummy block that is used to create the dummy content for all of the dummy files.

In some implementations, the content of each of the dummy files is not created from a single dummy block. Rather, each of the dummy files may be created from a unique dummy block (i.e. each file having a different dummy block) in order to "fingerprint" the dummy files to aid in identifying the nature of any data corruption or integrity issues. For example, the unique dummy block may include a full file name and directory path. The unique dummy block may include a file name, timestamp and or inode.

Verifying the integrity of the dummy files with module 116 may include comparing a first block of one of the dummy files to a second block of the same dummy file. By way of non-limiting example, verifying the integrity of the dummy files may further include comparing the first block of the one dummy file to a third block of the same dummy file, and if the first, second and third blocks match perfectly, defining one of the three blocks as a "pristine block." The pristine block may be defined after it has been compared to and perfectly matches n other blocks, where n may be an integer that can be customized by a user.

The pristine block may be compared to all other dummy blocks in the same dummy file. If a dummy block does not match the pristine block, a determination may be made as to whether neighboring blocks also do not match the pristine block but match each other in order to help diagnose the nature of corruption or integrity issues. The process of defining a pristine block and comparing it to all other blocks in the same dummy file may be performed on each of the dummy files in the directory tree structure.

A checksum procedure may be used instead of using a pristine block to verify the integrity of all files in the directory tree structure that are no greater than a predetermined size. The predetermined size may be 8 KB. Alternatively, a checksum procedure may be used instead of a pristine block for all files in the directory tree structure that have less than a predetermined number of dummy blocks. In some implementations, the predetermined number of dummy blocks is two.

In some implementations, a file modification module 118 may be provided to modify the dummy files on the system of storage devices after the dummy files have been written by writing module 112. In these implementations, the dummy files may be written, modified and read many times before their integrity is verified by module 116.

Percentage selection module 120 and file selection module 122 may be configured to provide a first percentage of the files to be created with the dummy content that are to have the first file size. In some implementations, a user is allowed to select both the first percentage of files and the first file size. Modules 120 and 122 may also be configured to provide a second percentage of the files to be created with the dummy content that are to have the second file size. In some implementations, a user is allowed to select both the second percentage of files and the second file size. File size selection module 122 may also be configured to provide a default file size such that any remaining percentage of the files to be created with the dummy content that fall outside of the first and the second percentages (and any other similarly selected percentages) are to have the default file size. In some implementations, a user is allowed to select the default file size. For example, a user may select a first percentage of 40%, a first file size of 10 kilobytes (K), a second percentage of 2%, a second file size of 2 gigabytes (G), and a default file size of 1 kilobyte (K). In this example, when system 100 is creating dummy files, 40% of the files will have a size of 10K, 2% will have a size of 2G, and 58% (the remainder of the files) will have the default file size of 1K. In some implementations, a third percentage and a third file size may be selected in a similar manner. In some implementations, additional percentages and file sizes may be selected. If the total of the percentages add up to be less than 100%, the remaining percentage of files will have the default file size.

As previously mentioned, system 100 may be configured to simulate a plurality of workloads to simultaneously/concurrently write, read or write and read the directory tree structure and the dummy files of the plurality of simulated workloads to the system of storage devices. In such implementations, percentage selection module 120 and file size selection module 122 may be configured to allow a user to select different (unique) percentages and different (unique) files sizes for each of the simulated workloads. More specifically, percentage selection module 120 may be configured to select a first unique percentage of the files to be created with the dummy content that are to have a first file size for each of the plurality of simulated workloads. Percentage selection module 120 may also be configured to select a second unique percentage of the files to be created with the dummy content that are to have a second file size for each of the plurality of simulated workloads. File size selection module 122 may be configured to select a first unique file size for each of the plurality of simulated workloads, and a second unique file size for each of the plurality of simulated workloads. File size selection module 122 may also be configured to select a default unique file size for each of the plurality of simulated workloads, such that any remaining percentage of the files to be created with the dummy content that fall outside of the first and the second unique percentages and any other similarly selected percentages are to have the default unique file size.

In some implementations, by way of non-limiting example, the metadata may include at least one item from the group consisting of a file's owner, a group that the owner may belong to, file permissions, file size, tags and labels. Metadata operations that the workload can generate include changing access permissions, file over, and other tags that can be added to the file for real-world simulated testing.

The dummy files may be self-verified during the verifying step without accessing the real-world data from the deployed production environment.

In some implementations, computing platform(s) 102, remote platform(s) 104, and/or external resources 124 may be operatively linked via one or more electronic communication links. For example, such electronic communication links may be established, at least in part, via a network such as the Internet and/or other networks. It will be appreciated that this is not intended to be limiting, and that the scope of this disclosure includes implementations in which computing platform(s) 102, remote platform(s) 104, and/or external resources 124 may be operatively linked via some other communication media.

A given remote platform 104 may include one or more processors configured to execute computer program modules. The computer program modules may be configured to enable an expert or user associated with the given remote platform 104 to interface with system 100 and/or external resources 124, and/or provide other functionality attributed herein to remote platform(s) 104. By way of non-limiting example, a given remote platform 104 and/or a given computing platform 102 may include one or more of a server, a desktop computer, a laptop computer, a handheld computer, a tablet computing platform, a NetBook, a Smartphone, and/or other computing platforms.

External resources 124 may include sources of information outside of system 100, external entities participating with system 100, and/or other resources. In some implementations, some or all of the functionality attributed herein to external resources 124 may be provided by resources included in system 100.

Computing platform(s) 102 may include electronic storage 126, one or more processors 128, and/or other components. Computing platform(s) 102 may include communication lines, or ports to enable the exchange of information with a network and/or other computing platforms. Illustration of computing platform(s) 102 in FIG. 1 is not intended to be limiting. Computing platform(s) 102 may include a plurality of hardware, software, and/or firmware components operating together to provide the functionality attributed herein to computing platform(s) 102. For example, computing platform(s) 102 may be implemented by a cloud of computing platforms operating together as computing platform(s) 102.

Electronic storage 126 may comprise non-transitory storage media that electronically stores information. The electronic storage media of electronic storage 126 may include one or both of system storage that is provided integrally (i.e., substantially non-removable) with computing platform(s) 102 and/or removable storage that is removably connectable to computing platform(s) 102 via, for example, a port (e.g., a USB port, a firewire port, etc.) or a drive (e.g., a disk drive, etc.). Electronic storage 126 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 126 may include one or more virtual storage resources (e.g., cloud storage, a virtual private network, and/or other virtual storage resources). Electronic storage 126 may store software algorithms, information determined by processor(s) 128, information received from computing platform(s) 102, information received from remote platform(s) 104, and/or other information that enables computing platform(s) 102 to function as described herein.

Processor(s) 128 may be configured to provide information processing capabilities in computing platform(s) 102. As such, processor(s) 128 may include one or more of a digital processor, an analog processor, a digital circuit designed to process information, an analog circuit designed to process information, a state machine, and/or other mechanisms for electronically processing information. Although processor(s) 128 is shown in FIG. 1 as a single entity, this is for illustrative purposes only. In some implementations, processor(s) 128 may include a plurality of processing units. These processing units may be physically located within the same device, or processor(s) 128 may represent processing functionality of a plurality of devices operating in coordination. Processor(s) 128 may be configured to execute modules 108, 110, 112, 114, 116, 118, 120, and/or 122, and/or other modules. Processor(s) 128 may be configured to execute modules 108, 110, 112, 114, 116, 118, 120, and/or 122, and/or other modules by software; hardware; firmware; some combination of software, hardware, and/or firmware; and/or other mechanisms for configuring processing capabilities on processor(s) 128. As used herein, the term "module" may refer to any component or set of components that perform the functionality attributed to the module. This may include one or more physical processors during execution of processor readable instructions, the processor readable instructions, circuitry, hardware, storage media, or any other components.

It should be appreciated that although modules 108, 110, 112, 114, 116, 118, 120, and/or 122 are illustrated in FIG. 1 as being implemented within a single processing unit, in implementations in which processor(s) 128 includes multiple processing units, one or more of modules 108, 110, 112, 114, 116, 118, 120, and/or 122 may be implemented remotely from the other modules. The description of the functionality provided by the different modules 108, 110, 112, 114, 116, 118, 120, and/or 122 described below is for illustrative purposes, and is not intended to be limiting, as any of modules 108, 110, 112, 114, 116, 118, 120, and/or 122 may provide more or less functionality than is described. For example, one or more of modules 108, 110, 112, 114, 116, 118, 120, and/or 122 may be eliminated, and some or all of its functionality may be provided by other ones of modules 108, 110, 112, 114, 116, 118, 120, and/or 122. As another example, processor(s) 128 may be configured to execute one or more additional modules that may perform some or all of the functionality attributed below to one of modules 108, 110, 112, 114, 116, 118, 120, and/or 122.

Figure 2A:
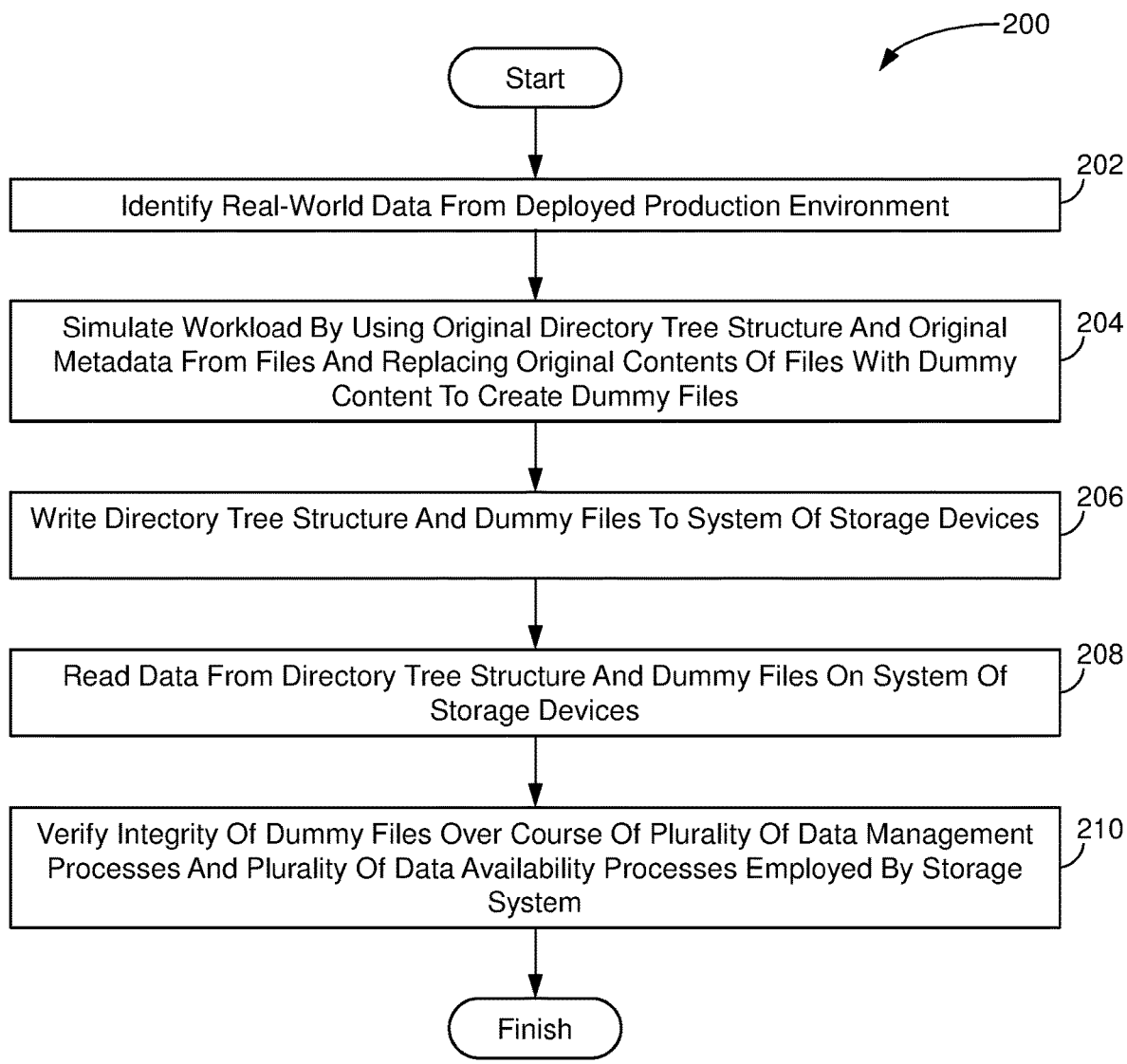
FIGS. 2A, 2B, 2C, and/or 2D illustrates a method for simulating real-world 10 workload for testing in a parallel and distributed storage system, in accordance with one or more implementations.
Figure 2B:
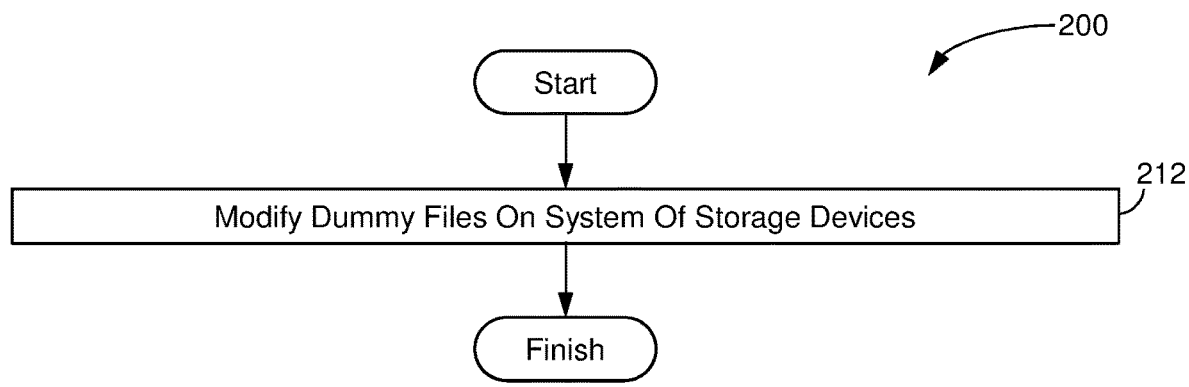
Figure 2C:
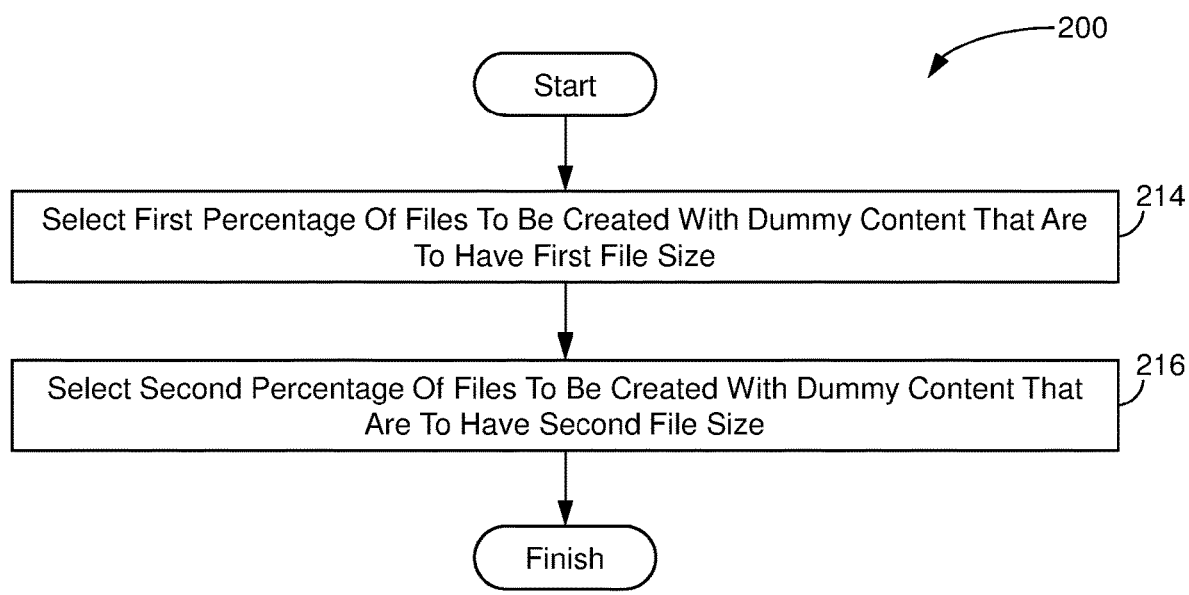

FIGS. 2A, 2B, 2C, and/or 2D illustrates a method 200 for simulating real-world 10 workload for testing in a parallel and distributed storage system, in accordance with one or more implementations. The operations of method 200 presented below are intended to be illustrative. In some implementations, method 200 may be accomplished with one or more additional operations not described, and/or without one or more of the operations discussed. Additionally, the order in which the operations of method 200 are illustrated in FIGS. 2A, 2B, 2C, and/or 2D and described below is not intended to be limiting.

In some implementations, method 200 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 200 in response to instructions stored electronically on an electronic storage medium. The one or more processing devices may include one or more devices configured through hardware, firmware, and/or software to be specifically designed for execution of one or more of the operations of method 200.

FIG. 2A illustrates method 200, in accordance with one or more implementations.

An operation 202 may include identifying real-world data from a deployed production environment. The data may include a directory tree structure and files. The files may include original metadata and original file contents. Operation 202 may be performed by one or more hardware processors configured by machine-readable instructions including a module that is the same as or similar to data identifying module 108, in accordance with one or more implementations.

An operation 204 may include simulating a workload by using the original directory tree structure and the original metadata from the files and replacing the original contents of the files with dummy content to create dummy files. Operation 204 may be performed by one or more hardware processors configured by machine-readable instructions including a module that is the same as or similar to workload simulation module 110, in accordance with one or more implementations.

An operation 206 may include writing the directory tree structure and dummy files to a system of storage devices. Operation 206 may be performed by one or more hardware processors configured by machine-readable instructions including a module that is the same as or similar to directory tree structure writing module 112, in accordance with one or more implementations.

An operation 208 may include reading data from the directory tree structure and dummy files on the system of storage devices. Operation 208 may be performed by one or more hardware processors configured by machine-readable instructions including a module that is the same as or similar to data reading module 114, in accordance with one or more implementations.

An operation 210 may include verifying the integrity of the dummy files over the course of a plurality of data management processes and a plurality of data availability processes employed by the storage system. Operation 210 may be performed by one or more hardware processors configured by machine-readable instructions including a module that is the same as or similar to integrity verification module 116, in accordance with one or more implementations.

FIG. 2B illustrates method 200, in accordance with one or more implementations.

An operation 212 may include the step of modifying the dummy files on the system of storage devices. Operation 212 may be performed by one or more hardware processors configured by machine-readable instructions including a module that is the same as or similar to file modification module 118, in accordance with one or more implementations. In some implementations, some or all of operations 206, 208 and 212 may be performed many times on some or all of the dummy files.

FIG. 2C illustrates method 200, in accordance with one or more implementations.

An operation 214 may include selecting a first percentage of the files to be created with the dummy content that are to have a first file size. Operation 214 may be performed by one or more hardware processors configured by machine-readable instructions including a module that is the same as or similar to percentage selection module 120, in accordance with one or more implementations.

An operation 216 may include selecting a second percentage of the files to be created with the dummy content that are to have a second file size. Operation 216 may be performed by one or more hardware processors configured by machine-readable instructions including a module that is the same as or similar to percentage selection module 120, in accordance with one or more implementations.

Figure 2D:
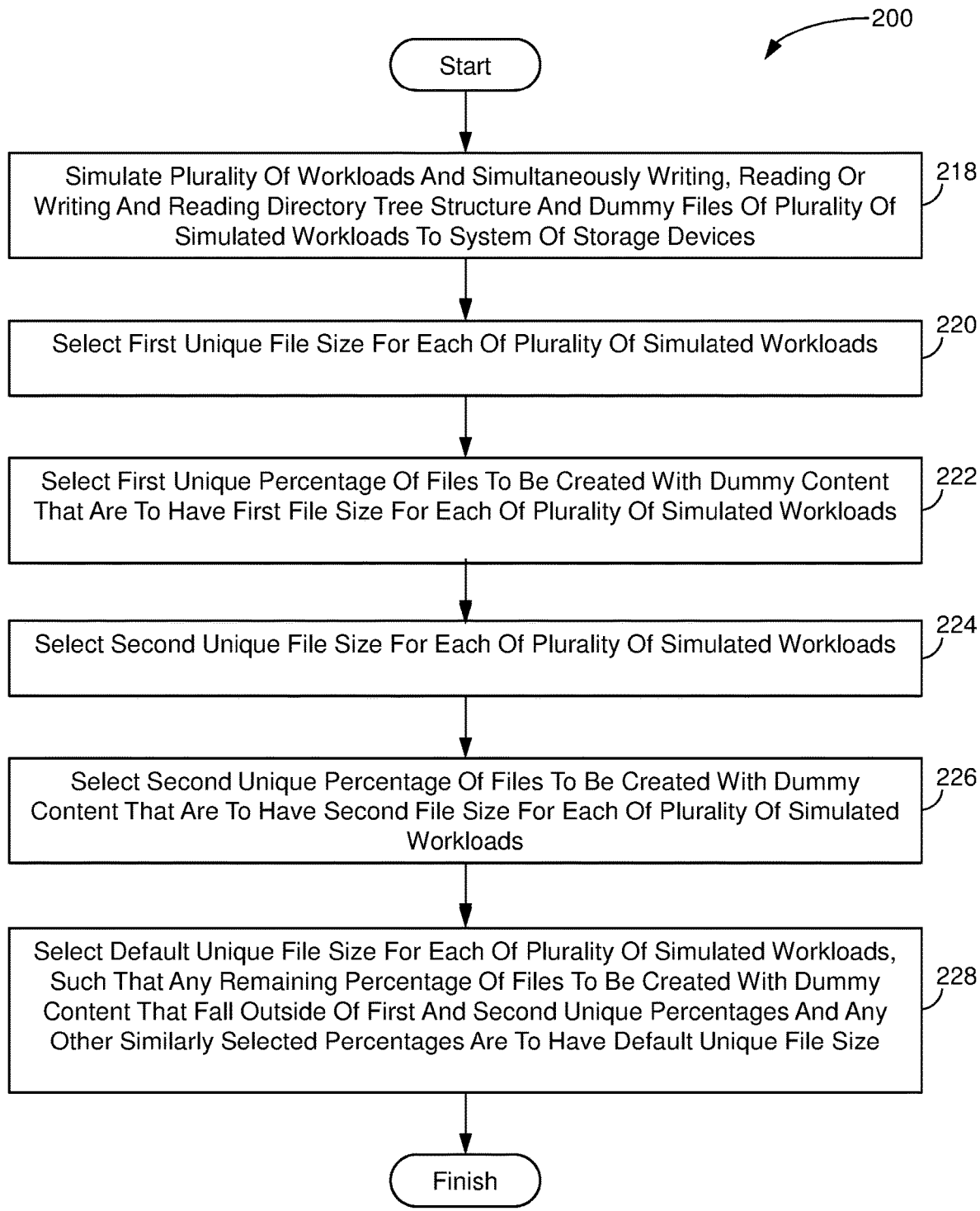

FIG. 2D illustrates method 200, in accordance with one or more implementations.

An operation 218 may include simulating a plurality of workloads and simultaneously/concurrently writing, reading or writing and reading the directory tree structure and the dummy files of the plurality of simulated workloads to the system of storage devices. Operation 218 may be performed by one or more hardware processors configured by machine-readable instructions including a module that is the same as or similar to workload simulation module 110, in accordance with one or more implementations.

An operation 220 may include selecting a first unique file size for each of the plurality of simulated workloads. Operation 220 may be performed by one or more hardware processors configured by machine-readable instructions including a module that is the same as or similar to file size selection module 122, in accordance with one or more implementations.

An operation 222 may include selecting a first unique percentage of the files to be created with the dummy content that are to have the first file size for each of the plurality of simulated workloads. Operation 222 may be performed by one or more hardware processors configured by machine-readable instructions including a module that is the same as or similar to percentage selection module 120, in accordance with one or more implementations.

An operation 224 may include selecting a second unique file size for each of the plurality of simulated workloads. Operation 224 may be performed by one or more hardware processors configured by machine-readable instructions including a module that is the same as or similar to file size selection module 122, in accordance with one or more implementations.

An operation 226 may include selecting a second unique percentage of the files to be created with the dummy content that are to have the second file size for each of the plurality of simulated workloads. Operation 226 may be performed by one or more hardware processors configured by machine-readable instructions including a module that is the same as or similar to percentage selection module 120, in accordance with one or more implementations.

An operation 228 may include selecting a default unique file size for each of the plurality of simulated workloads, such that any remaining percentage of the files to be created with the dummy content that fall outside of the first and the second unique percentages and any other similarly selected percentages are to have the default unique file size. Operation 228 may be performed by one or more hardware processors configured by machine-readable instructions including a module that is the same as or similar to file size selection module 122, in accordance with one or more implementations.

FIG. 3 illustrates method 200, in accordance with one or more implementations.

The exemplary configuration file illustrated in FIG. 3 allows a user to select a first unique file size for each of a plurality of simulated workloads. In this example, 10K is selected for a first workload, 1M is selected for a second workload, and 4K is selected for a third workload. The configuration file also allows a user to select a first unique percentage of files to have the first file size for each of the plurality of simulated workloads. In this example, 40% is selected for the first workload, 40% is selected for the second workload, and 80% is selected for the third workload. The configuration file also allows a user to select a second unique file size for each of the plurality of simulated workloads. In this example, 2G is selected for the first workload, 100M is selected for the second workload, and 10M is selected for the third workload. The configuration file also allows a user to select a second unique percentage of files to have the second file size for each of the plurality of simulated workloads. In this example, 2% is selected for the first workload, 40% is selected for the second workload, and 15% is selected for the third workload. The configuration file also allows a user to select a default unique file size for each of the plurality of simulated workloads. In this example, 1K is selected for the first workload, 1K is selected for the second workload, and 1K is selected for the third workload. The configuration file may also allow the user to provide the number of workloads or threads to simulate (three in this example), their directory locations, the locations of dummy content, and/or other configuration parameters. In this example, "file/gpfs/gcp-2m-me1/WORKLOAD-A/corp-file-aa.gz" may be the first of three data sets provided by a customer as input for the simulation tool.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

What is claimed is:

1. A system configured for simulating real-world IO workload for testing a parallel and distributed storage system, the system comprising:
   one or more hardware processors configured by machine-readable instructions to:
   identify real-world data from a deployed production environment, the data comprising a directory tree structure and files, wherein the files comprise original metadata and original file contents;
   simulate a workload by using the original directory tree structure and the original metadata from the files and replacing the original contents of the files with dummy content to create dummy files, wherein the step of replacing the original contents of the files comprises creating a dummy data block and replicating the dummy block multiple times within a file to obtain a desired file size for each of a plurality of the dummy files, wherein the dummy data block has a size of at least 4 KB;
   write the directory tree structure and dummy files to a system of storage devices;

read data from the directory tree structure and dummy files on the system of storage devices; and verify the integrity of the dummy files over the course of a plurality of data management processes and a plurality of data availability processes employed by the storage system.

2. The system of claim 1, wherein the one or more hardware processors are further configured by machine-readable instructions to modify the dummy files on the system of storage devices.

3. The system of claim 1, wherein the dummy block has a size that is user-definable.

4. The system of claim 1, wherein the dummy block has a size of at least 1 MB, each file has a size of at least 1 GB and the directory tree comprises at least 1000 files.

5. The system of claim 1, wherein the contents of the dummy block are stored in a buffer having the same size as the contents.

6. The system of claim 1, wherein the contents of the dummy block are randomly generated.

7. A method for simulating real-world IO workload for testing a parallel and distributed storage system, the method comprising:

identifying real-world data from a deployed production environment, the data comprising a directory tree structure and files, wherein the files comprise original metadata and original file contents;

simulating a workload by using the original directory tree structure and the original metadata from the files and replacing the original contents of the files with dummy content to create dummy files, wherein the step of replacing the original contents of the files comprises creating a dummy data block and replicating the dummy block multiple times within a file to obtain a desired file size for each of a plurality of the dummy files, wherein the dummy data block has a size of at least 4 KB;

writing the directory tree structure and dummy files to a system of storage devices;

reading data from the directory tree structure and dummy files on the system of storage devices; and verifying the integrity of the dummy files over the course of a plurality of data management processes and a plurality of data availability processes employed by the storage system.

8. The method of claim 7, further comprising the step of modifying the dummy files on the system of storage devices.

9. The method of claim 7, wherein the dummy block has a size that is user-definable.

10. The method of claim 7, wherein the dummy block has a size of at least 1 MB, each file has a size of at least 1 GB and the directory tree comprises at least 1000 files.

11. The method of claim 7, wherein the contents of the dummy block are stored in a buffer having the same size as the contents.

12. The method of claim 7, wherein the contents of the dummy block are randomly generated.

13. A non-transient computer-readable storage medium having instructions embodied thereon, the instructions being executable by one or more processors to perform a method for simulating real-world IO workload for testing a parallel and distributed storage system, the method comprising:

identifying real-world data from a deployed production environment, the data comprising a directory tree structure and files, wherein the files comprise original metadata and original file contents;

simulating a workload by using the original directory tree structure and the original metadata from the files and replacing the original contents of the files with dummy content to create dummy files, wherein the step of replacing the original contents of the files comprises creating a dummy data block and replicating the dummy block multiple times within a file to obtain a desired file size for each of a plurality of the dummy files, wherein the dummy data block has a size of at least 4 KB;

writing the directory tree structure and dummy files to a system of storage devices;

reading data from the directory tree structure and dummy files on the system of storage devices; and verifying the integrity of the dummy files over the course of a plurality of data management processes and a plurality of data availability processes employed by the storage system.

14. The computer-readable storage medium of claim 13, wherein the method further comprises the step of modifying the dummy files on the system of storage devices.

15. The computer-readable storage medium of claim 13, wherein the dummy block has a size that is user-definable.

16. The computer-readable storage medium of claim 13, wherein the dummy block has a size of at least 1 MB, each file has a size of at least 1 GB and the directory tree comprises at least 1000 files.

17. The computer-readable storage medium of claim 13, wherein the contents of the dummy block are stored in a buffer having the same size as the contents.

\* \* \* \* \*